United States Patent
van Hooft et al.

(10) Patent No.: US 9,918,545 B2
(45) Date of Patent: Mar. 20, 2018

(54) STAND FOR A PORTABLE DEVICE WITH A GRAPHIC USER INTERFACE DISPLAY

(71) Applicant: BakkerElkhuizen Innovations B.V., Almere (NL)

(72) Inventors: Jan Thomas Lambertus van Hooft, Almere (NL); Tristan Margareth Raphael Petronella Frencken, 's-Hertogenbosch (NL)

(73) Assignee: BakkerElkhuizen Innovations B.V., Almere (NL)

( * ) Notice: Subject to any disclaimer, the term of this patent is extended or adjusted under 35 U.S.C. 154(b) by 0 days.

(21) Appl. No.: 14/765,632

(22) PCT Filed: Feb. 4, 2013

(86) PCT No.: PCT/NL2013/050055
§ 371 (c)(1),
(2) Date: Aug. 4, 2015

(87) PCT Pub. No.: WO2014/119993
PCT Pub. Date: Aug. 7, 2014

(65) Prior Publication Data
US 2015/0359328 A1   Dec. 17, 2015

(51) Int. Cl.
*A47B 23/04* (2006.01)
*F16M 11/04* (2006.01)
(Continued)

(52) U.S. Cl.
CPC .............. *A47B 23/043* (2013.01); *F16B 1/00* (2013.01); *F16M 11/04* (2013.01); *F16M 11/10* (2013.01);
(Continued)

(58) Field of Classification Search
CPC . A45C 2011/003; G06F 1/1628; F16M 11/04; H05K 5/0234; A47B 23/043; A47B 2023/049
(Continued)

(56) References Cited

U.S. PATENT DOCUMENTS 2,611,572 A * 9/1952 La Rocca ................. G09F 1/06
248/174
3,447,770 A * 6/1969 Gallamos ............. A47B 23/043
248/453
(Continued)

FOREIGN PATENT DOCUMENTS

CN 202049413 11/2011
DE 20 2010 002781 8/2010
(Continued)

OTHER PUBLICATIONS

International Search Report from PCT/NL2014/050124 dated Nov. 7, 2014.
(Continued)

*Primary Examiner* — Eret C McNichols
(74) *Attorney, Agent, or Firm* — Swanson & Bratschun, L.L.C.

(57) ABSTRACT

A stand for a portable device such as a laptop computer or a tablet computer has a first panel, a second panel hinged to the first panel for supporting the first panel and an angle setting tongue hinged to the first panel or the second panel and connectable to the other one of these panels for setting an angle between these panels. First and second panel members of a first layer define the first and second panels and are attached to a relatively flexible second layer. Portions of the angle setting tongue opposite parts of the first layer when the stand is in a flat folded transport position, are
(Continued)

free from material of the first layer. A method for manufacturing such a stand is also disclosed.

10 Claims, 6 Drawing Sheets

(51) Int. Cl.
| | | |
|---|---|---|
| G06F 1/16 | (2006.01) | |
| F16M 11/10 | (2006.01) | |
| F16M 13/00 | (2006.01) | |
| F16B 1/00 | (2006.01) | |
| H05K 5/02 | (2006.01) | |
| A45C 11/00 | (2006.01) | |

(52) U.S. Cl.
CPC ............ *F16M 13/00* (2013.01); *G06F 1/1628* (2013.01); *H05K 5/0234* (2013.01); *A45C 2011/003* (2013.01); *A47B 2023/049* (2013.01); *F16B 2001/0035* (2013.01); *Y10T 29/49828* (2015.01)

(58) Field of Classification Search
USPC .......................................... 248/454–456, 447
See application file for complete search history.

(56) References Cited

U.S. PATENT DOCUMENTS

| | | | |
|---|---|---|---|
| 4,197,618 A | 4/1980 | Bourguignon | |
| 4,622,767 A * | 11/1986 | Sullivan | A47G 1/143 248/463 |
| 4,674,724 A * | 6/1987 | Gaudet | A47B 23/044 248/459 |
| 5,083,663 A * | 1/1992 | Conway | B65D 5/5206 206/45.26 |
| 5,234,190 A * | 8/1993 | Cross | A47B 97/08 248/459 |
| 5,253,840 A * | 10/1993 | Sheremetta | A47B 23/043 248/205.3 |
| 5,413,305 A | 5/1995 | Leeb | |
| 5,451,025 A * | 9/1995 | Hames | A47B 23/043 248/452 |
| 6,082,696 A * | 7/2000 | Patterson | F16M 11/10 248/447 |
| 6,098,952 A | 8/2000 | Tonn | |
| 6,515,852 B2 | 2/2003 | Huang | |
| 6,538,642 B2 | 3/2003 | Tsai | |
| 6,557,897 B1 * | 5/2003 | Gaudet | A47B 23/044 248/455 |
| 6,585,217 B2 | 7/2003 | Huang | |
| 6,672,549 B2 * | 1/2004 | Kolb | B60R 11/0241 248/127 |
| 6,898,075 B2 | 5/2005 | Li | |
| 6,967,836 B2 * | 11/2005 | Huang | A45C 3/02 361/679.46 |
| 7,248,904 B2 | 7/2007 | Gartrell | |
| 7,281,698 B2 | 10/2007 | Patterson, Jr. | |
| 7,694,920 B2 | 4/2010 | Lien | |
| 7,735,644 B2 * | 6/2010 | Sirichai | A45F 5/02 206/320 |
| 7,758,009 B1 | 7/2010 | Chang | |
| 7,861,995 B2 * | 1/2011 | Liou | F16M 11/105 248/454 |
| D651,213 S * | 12/2011 | Magness | D14/447 |
| 8,100,376 B2 * | 1/2012 | Ye | A47B 23/043 248/454 |
| 8,230,992 B2 | 7/2012 | Law | |
| 8,282,065 B1 | 10/2012 | Stone | |
| 8,382,059 B2 * | 2/2013 | Le Gette | F16M 11/04 248/163.1 |
| 8,714,351 B2 | 5/2014 | Toulotte | |
| 8,749,960 B2 | 6/2014 | Mori | |
| 8,797,132 B2 * | 8/2014 | Childs | A45C 11/00 206/320 |
| 8,833,554 B2 * | 9/2014 | Busri | A45C 11/00 206/320 |
| 8,910,915 B2 * | 12/2014 | Wibby | A47B 23/043 206/45.2 |
| 8,925,722 B2 * | 1/2015 | Poon | F16M 13/00 206/320 |
| 8,960,421 B1 | 2/2015 | Diebel | |
| 9,013,863 B2 | 4/2015 | Hsu | |
| D741,070 S * | 10/2015 | Martin | D14/375 |
| 9,203,945 B2 * | 12/2015 | Chin | G06F 1/1628 |
| 9,267,638 B2 * | 2/2016 | Le Gette | F16M 11/04 |
| 9,287,917 B1 * | 3/2016 | Tages | H04B 1/3888 |
| 9,307,656 B2 * | 4/2016 | Murchison | H05K 5/0013 |
| 9,308,767 B1 * | 4/2016 | Waldron | B42D 15/042 |
| 9,377,810 B2 * | 6/2016 | Hishinuma | G06F 1/1613 |
| 9,382,033 B2 * | 7/2016 | Poon | F16M 13/00 |
| 9,489,015 B2 * | 11/2016 | Gioscia | G06F 1/1628 |
| 9,762,713 B2 * | 9/2017 | Lambert | H04B 1/3877 |
| 9,800,283 B2 | 10/2017 | Schmidt | |
| 2003/0089832 A1 | 5/2003 | Gold | |
| 2003/0213886 A1 | 11/2003 | Gilbert | |
| 2004/0001047 A1 | 1/2004 | Wang | |
| 2006/0007645 A1 * | 1/2006 | Chen | G06F 1/1626 361/679.04 |
| 2007/0283855 A1 | 12/2007 | Pozzi | |
| 2008/0302687 A1 | 12/2008 | Sirichai | |
| 2010/0053876 A1 | 3/2010 | Widmer | |
| 2010/0283269 A1 | 11/2010 | Fiedler | |
| 2011/0069446 A1 | 3/2011 | Trang | |
| 2011/0163211 A1 | 7/2011 | Cicco | |
| 2011/0192857 A1 | 8/2011 | Rothbaum | |
| 2011/0227463 A1 | 9/2011 | Hou | |
| 2012/0018324 A1 | 1/2012 | Hale | |
| 2012/0037047 A1 | 2/2012 | Moldovan | |
| 2012/0072167 A1 | 3/2012 | Cretella, Jr. | |
| 2012/0075789 A1 | 3/2012 | Decamp | |
| 2012/0103855 A1 | 5/2012 | Gaddis, II | |
| 2012/0217174 A1 * | 8/2012 | Ting | G06F 1/1628 206/45.2 |
| 2012/0305739 A1 | 12/2012 | Huang | |
| 2012/0318950 A1 | 12/2012 | Wilber | |
| 2012/0325689 A1 | 12/2012 | Wibby | |
| 2013/0009878 A1 | 1/2013 | Wu | |
| 2013/0015310 A1 | 1/2013 | Wu | |
| 2013/0016467 A1 | 1/2013 | Ku | |
| 2013/0114198 A1 * | 5/2013 | Gengler | B65D 25/00 361/679.08 |
| 2013/0214661 A1 * | 8/2013 | McBroom | G06F 1/1667 312/325 |
| 2014/0183314 A1 | 7/2014 | Mulhern | |
| 2015/0173221 A1 * | 6/2015 | Yoo | H05K 5/0234 248/455 |
| 2015/0194998 A1 | 7/2015 | Fathollahi | |
| 2015/0359120 A1 * | 12/2015 | Huang | A45C 11/00 206/45.23 |
| 2015/0374118 A1 | 12/2015 | van Hooft | |
| 2017/0009934 A1 | 1/2017 | van Hooft | |

FOREIGN PATENT DOCUMENTS

| | | | | |
|---|---|---|---|---|
| DE | 202011000630 U1 * | 10/2011 | ............ | A45C 11/00 |
| DE | 20 2011 101534 | 11/2011 | | |
| EP | 1301847 | 3/2004 | | |
| EP | 1031847 | 6/2006 | | |
| EP | 1577737 | 12/2006 | | |
| EP | 2189873 | 5/2010 | | |
| EP | 1536717 | 8/2011 | | |
| EP | 1447024 | 12/2011 | | |
| EP | 2487877 | 8/2012 | | |
| GB | 2512839 A * | 10/2014 | ............ | A45C 11/00 |
| NL | 1038362 | 11/2010 | | |
| WO | WO 2003/056956 | 7/2003 | | |
| WO | WO -2004034839 A1 * | 4/2004 | ........... | A47B 23/043 |
| WO | WO 2009/131841 | 10/2009 | | |
| WO | WO 2010/036090 A3 | 4/2010 | | |
| WO | WO 2012/016158 | 2/2012 | | |

(56) References Cited

FOREIGN PATENT DOCUMENTS

| WO | WO-2012111994 A2 * | 8/2012 | ........... G06F 1/1626 |
|---|---|---|---|
| WO | WO 2012/125912 | 9/2012 | |
| WO | WO 2012/166820 | 12/2012 | |
| WO | WO 2013/158057 | 10/2013 | |
| WO | WO 2013/162963 | 10/2013 | |

OTHER PUBLICATIONS

International Search Report and Written Opinion from PCT/NL2013/050054 dated Nov. 5, 2013.
International Search Report and Written Opinion from PCT/NL2013/050055 dated Jul. 31, 2013.
Examination Report from EP App No. 13 705 844.2 dated Jan. 23, 2017.
Office Action from U.S. Appl. No. 14/765,727 dated Feb. 10, 2017.
Office Action from U.S. Appl. No. 15/121,315 dated Feb. 9, 2017.
Office Action from U.S. Appl. No. 14/765,727 dated Oct. 31, 2017.
Office Action from U.S. Appl. No. 15/121,315 dated Dec. 12, 2017.

* cited by examiner

STAND FOR A PORTABLE DEVICE WITH A GRAPHIC USER INTERFACE DISPLAY

RELATED APPLICATIONS

This application is a 35 U.S.C. § 371 national phase application of PCT/NL2013/050055 (WO 2014/119993), filed on Feb. 4, 2013, entitled "Stand for a Portable Device With a Graphic User Interface Display", which is incorporated herein by reference in its entirety.

FIELD AND BACKGROUND OF THE INVENTION

The present invention relates to a stand for a portable device with a graphic user interface, such as a laptop computer or a tablet computer.

Portable computers, usually denoted by the term "laptop computer", "laptop" or "notebook" are not only used during travel, but are also used frequently and for long periods in offices, in particular by users who use the computer regularly in different offices and/or at home. Frequent and prolonged use also occurs in the use of tablet computers that can be operated by touching fields displayed on the display screen, in particular when such devices are (also) operated using a keyboard.

Frequent and prolonged use of such portable computers, of which the design is to a large extent adapted for compactness and portability, entails a number of ergonomic drawbacks. Typically, the position of the display is not sufficiently high, which causes a great risk of neck complaints. For tablet computers an additional problem is supporting the device at a suitable angle so that the display faces in a direction matching the desired viewing angle.

For supporting the display of a laptop computer in an ergonomically better position, a wide variety of laptop supports are known. Examples of laptop supports are shown in applicant's European Patents 1 301 847, 1 447 024 and 1 577 737.

Most laptop supports are intended to be left at a place to work and to be used by user bringing the laptop computer to that place to work. Some laptop and tablet computer stands are foldable to a flat configuration so that also the laptop stand can easily be carried along with the laptop computer and the laptop, such laptop supports are disclosed in European Patents 1 301 847 and 1 447 024. European patent 1 536 717 and U.S. Pat. No. 6,098,952 disclose foldable laptop supports arranged to be attached to a bottom of a keyboard portion of a laptop computer. International patent application WO2010/036090 and U.S. patent application publ. nr. 2012/0072167 disclose supports attachable to a tablet computer.

SUMMARY OF THE INVENTION

It is an object of the present invention to provide a stand for a portable device with a graphic user interface display, such as a laptop computer or a tablet computer, which is particularly light and flat.

According to the invention, this object is achieved by providing a stand for a portable device with a graphic user interface display, such as a laptop computer or a tablet computer, the stand allowing the device to be supported with a bottom face at an oblique angle relative to a top surface carrying the stand, the stand including:
a first panel;
a second panel hinged so as to be pivotable relative to the first panel about a first hinge axis, so as to support the first panel at the oblique angle when in an unfolded operating position; and
an angle setting tongue hinged so as to be pivotable relative to the first panel or the second panel about a second hinge axis spaced from the first hinge axis and having a free end releasably connectable to the other one of the first panel and the second panel at positions at a distance below the first hinge axis, when in the unfolded operating position, for setting an angle between the first panel and the second panel; wherein
a first panel member of a first layer defines the first panel;
a second panel member of the first layer defines the second panel;
the first and the second panel members are attached to a second layer which is more flexible than the panel members of the first layer, a portion of the second layer between adjacent edges of the first and second panel members forming a hinge about which the second panel is pivotable relative to the first panel about the first hinge axis;
the angle setting tongue comprises a portion of the second layer projecting away from the first or second panel member; and
all portions of the angle setting tongue located opposite parts of the first layer when the stand is in a flat folded transport position, are free from material of the first layer.

Because the angle setting tongue comprises a portion of the second layer projecting away from the first or second panel member and all portions of the angle setting tongue located opposite parts of the first layer when the stand is in a flat folded transport position are free from material of the first layer, a stand is obtained which the angle setting tongue adds at most very little to the overall thickness. Since the ends of the angle setting tongue are pulled apart when the stand supports a laptop or other device, stiffening of the angle setting tongue is not necessary and the flexible hinge forming material of the second layer is stiff enough to engage the other panel to maintain the panels at the desired angle while a laptop or similar device is supported by the stand.

The invention can also be embodied in a method of manufacturing a stand for supporting a portable device with a graphic user interface display, such as a laptop computer or a tablet computer, with a bottom face at an oblique support angle relative to a top surface carrying the stand, the stand including:
a first panel for supporting the device; and
a second panel hinged so as to be pivotable relative to the first panel about a first hinge axis;
an angle setting tongue hinged so as to be pivotable relative to the first panel or the second panel about a second hinge axis spaced from the first hinge axis and having a free end releasably connectable to the other one of the first panel and the second panel at positions at a distance below the first hinge axis for setting an angle between the first panel and the second panel; the method including:
providing a first panel member of a first layer defining the first panel;
providing a second panel member of the first layer defining the second panel;
providing a blank forming a second layer which is more flexible than the panel members;
attaching the first and the second panel members to the blank, such that a portion of the second layer between adjacent edges of the first and second panel members forms a hinge about which the second panel is pivotable relative to the first panel about the first hinge axis; and the angle setting tongue comprises a portion of the blank forming the second layer that projects away from the first or second panel member.

Because first the panels of the first layer and a blank forming the second layer are provided and subsequently attached to each other, it is relatively easy to obtain a layered structure with differently shaped first and second layers, wherein large areas of the second layer project are not laminated with material of the first layer.

Preferably at least one attachment member, such as a magnet, a magnetically attractable element or a half of a hook and loop fastener pair, is embedded in an opening in the first or second layer. This allows to efficiently incorporate such attachment members in an unobtrusive manner not adding to the thickness of the stand in folded condition.

The at least one attachment member can include a magnet or magnetically attractable element and be arranged for co-operation with a magnet or magnetically attractable element that is part of or embedded in the second or, respectively, first layer for releasably holding the angle setting tongue and/or the second panel in a transport position parallel to the first and second panels. Thus, the thin and relatively flexible angle setting tongue is reliably held in a position lying flat against the panels of the stand when the stand is in flat folded transport position, without requiring any manipulations for securing the angle setting tongue.

Preferably, the stand further comprises a third layer more flexible and thinner than the first and second layers. Such a thin and flexible third layer can cover the opening or openings and thus keep the attachment member or members therein in place, cover the different materials of the first and second layer for a uniform visual appearance and provide a smooth transition over edges of the first and second layer and to the bottom of the supported device, to the shape of which it can easily accommodate.

If it is provided that the angle setting tongue projects from the second panel to an attachment member of the first panel and that the second layer of the second panel is on a side of the first layer of the second panel facing away from the attachment member, tension exerted on the angle setting tongue due to the weight of the supported device urging the first and second panels apart, causes the angle setting tongue to pull the second layer of the second panel to against the relatively stiff first layer and not away from the first layer. Thus, peeling off of the second layer is reliably avoided without requiring additional attachment members that would add to manufacturing costs and may add to the thickness.

In a stand according to the invention, portions of the first and the second panels are preferably located opposite parts of the angle setting tongue when the stand is in a flat folded transport position to avoid the need of split panels. It is then further preferred that at least all of these portions of the first and the second panels are free from material of the second layer. Thus, the panels do not include material of the second layer in areas overlapped by the angle setting tongue, so that the angle setting tongue can be folded flat to a position between lands of material of the second layer that are part of the first and second panel and, accordingly, does not add significantly to the thickness of the stand in the folded configuration.

The invention also provides a particularly efficient manner of manufacturing a foldable stand. According to the invention, first, a first panel member of a first layer defining the first panel, a second panel member of the first layer defining the second panel, and a blank forming a second layer which is more flexible than the panel members are provided. Then, the first and the second panel members are attached to the blank, such that a portion of the second layer between adjacent edges of the first and second panel members forms a hinge about which the second panel is pivotable relative to the first panel about the first hinge axis; and the angle setting tongue comprises a portion of the blank forming the second layer that projects away from the first or second panel member. In particular, such a method allows efficient and even on demand manufacturing of laptop stands specifically shaped to match the shape of a bottom and cooling requirements of a device for which it is intended. The blanks forming the first and second panel members of the first layer and the second layer may for instance be cut and attached to each other on demand and can be cut and assembled efficiently in small series.

When manufacturing a stand according to the invention, preferably at least one attachment member is arranged in an opening in the first and/or second layer. This allows to efficiently and reliably arrange the attachment members or members at predetermined positions.

It is then further preferred that the blank forming the third layer is subsequently attached to the first and/or second layer, the third layer closing off at least one of the openings in the first and/or second layer. Thus the finishing of the stand and enclosure of the attachment members is carried out in a single operation. The third layer preferably has a self-adhesive layer on one of its sides, so that it can be fixed to the first and/or second layer quickly and easily.

Further features, effects and details of the invention appear from the detailed description and the drawings.

DETAILED DESCRIPTION

Figures 5, 6:
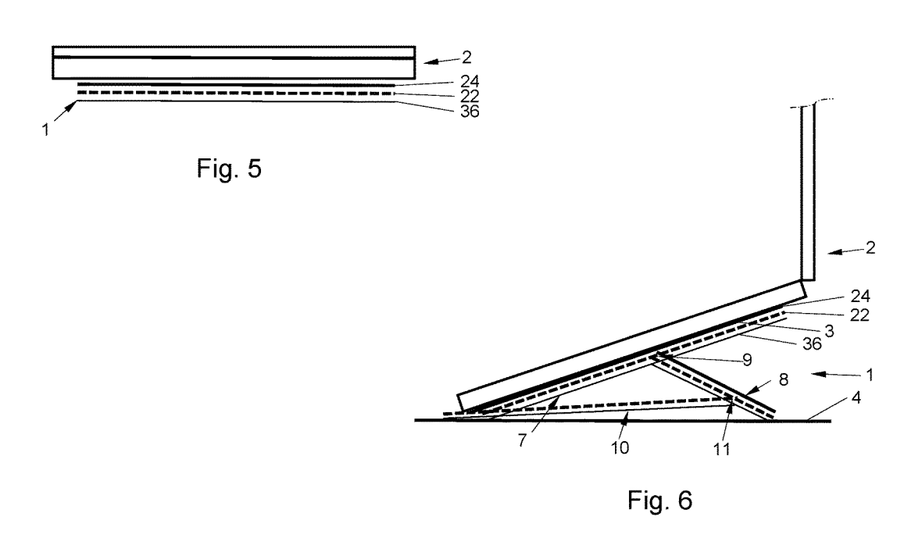
FIG. 5 is a schematic cross-sectional side view of a laptop and a stand in collapsed condition in side view along the line V-V in FIG. 1.
FIG. 6 is a schematic side view of the stand according to FIGS. 1 and 5 in a configuration for use supporting a laptop computer.

A first example of a stand 1 according to the invention is shown in FIGS. 1-6. The stand 1 can also be attached to a bottom of another portable device with a graphic user interface display, such as a tablet computer. As is shown in FIG. 6, in erected, i.e. unfolded condition, the stand 1 supports the portable device 2, with a bottom face 3 at an oblique support angle relative to a top surface 4, such as a desktop surface, carrying the stand 1. For a laptop computer, the main advantage of using such a stand is that the display portion is lifted so that it can be viewed by a user at an ergonomically better viewing angle. This is achieved because the stand 1 holds the rear end of the keyboard portion of the laptop computer 1, where the display portion is hinged thereto, in a position lifted from the desktop surface, preferably over a distance of at least 5 cm and more preferably over a distance of at least 10 cm. It is also preferred that the distance over which the rear end of the keyboard portion 6 of the laptop computer 1 is lifted from the top surface 4 on which the stand 1 rests is adjustable. To that end, the angle α at which the stand 1 supports the keyboard portion 6 relative to the plane of the top surface 4 is preferably adjustable.

For portable devices with a touch screen, such as tablet computers, the purpose of supporting the device at an angle relative to the top surface 4 resides in orienting the display so that it faces more in the direction of view than when lying flat on the top surface 4 and can be operated more easily.

The stand 1 according to the present example is composed of a first panel 7 for supporting the device 1, a second panel 8 hinged so as to be pivotable relative to the first panel 7 about a first hinge axis 9 and angle setting tongues 10. The angle setting tongue 10 is hinged so as to be pivotable relative to the first panel 7 about a second hinge axis 11 spaced below the first hinge axis 9 and is releasably connectable to the second panel 8 in a plurality of positions for adjusting a setting angle between the first panel 7 and the second panel 8.

The stand according to the present example is specifically arranged to be attached to the bottom of the device 2, so that transporting it along with the device 2 does not entail packing and unpacking an additional separate item. Moreover, by attaching the device 2 to the stand 1, reliable positioning of the device 2 on the stand 1, when supported in a position for use is ensured.

The stand 1 has flexible attachment flaps 12 projecting from and extending along edges 14 of a panel member 7' defining the first panel 7. The flaps 12 have attachment surfaces for attachment to the bottom surface 3 of the device 2. The flexible attachment flaps 12 allow to more evenly and easily adapt the shape of the stand 1 along its contour to the shape of the bottom 3 of the device 2, so that a smoother transition from the outer surface of the stand 1 to the outer surface 3 of the device 2 is obtained. A more smooth transition from the stand 1 to the device 2 reduces the likelihood that an outer edge of the stand 1 clings to or damages other items, such as books and papers when the device with the stand 1 is inserted into for instance a briefcase or bag and makes the stand 1 visually less obtrusive. A better accommodation of the shape of the stand 1 to the shape of the bottom face 3 of the device 2 where it is attached to the device 2 also facilitates a reliable attachment of the stand 1 to the device 2.

The stand 1 has three layers 22, 24 and 36 that are mutually attached, for instance by adhesives. A first one of the outer layers 24 is on a side facing the supported computer 2 when in attached condition and has a flexural stiffness higher than the flexural stiffness of the other two layers 22 and 36. The first, stiff layer 24 is composed of mutually separate panel members 7', 8', which define the first panel and second panels 7, 8 of the stand 1. The panel members 7', 8' of the first outer layer 24 are preferably made of steel which allows to achieve a high stiffness at a small thickness and which is a magnetic material, so it can co-operate with magnets embedded in the central layer 22. The first one of the outer layers 24 is laminated, for instance by an adhesive layer, to the central layer 22. The central layer 22 is preferably made of a polymeric material which is flexible enough to form the hinge between the panels 7, 8, such as polyethylene or polypropylene.

The central layer 22 has incisions 37 shaped and positioned to match the shape and positions of the spacing between the panels members 7' and 8' along the portions of that spacing adjoining a hinge 9 formed by a, preferably creased, strip-shaped portion of the layer 22 between ends of incisions 37.

Figure 7:
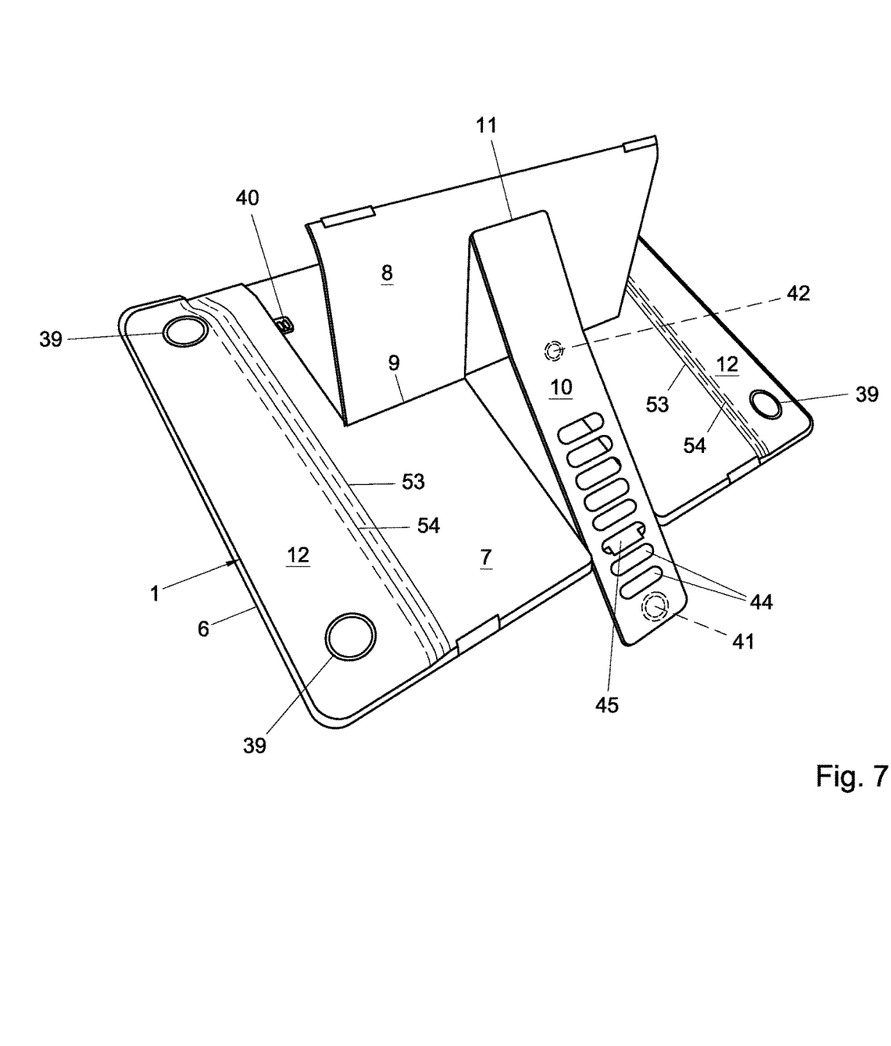
FIG. 7 is a perspective bottom view of a stand according to FIGS. 1-6 in an unfolded condition attached to a bottom of a laptop computer.
Figure 8:
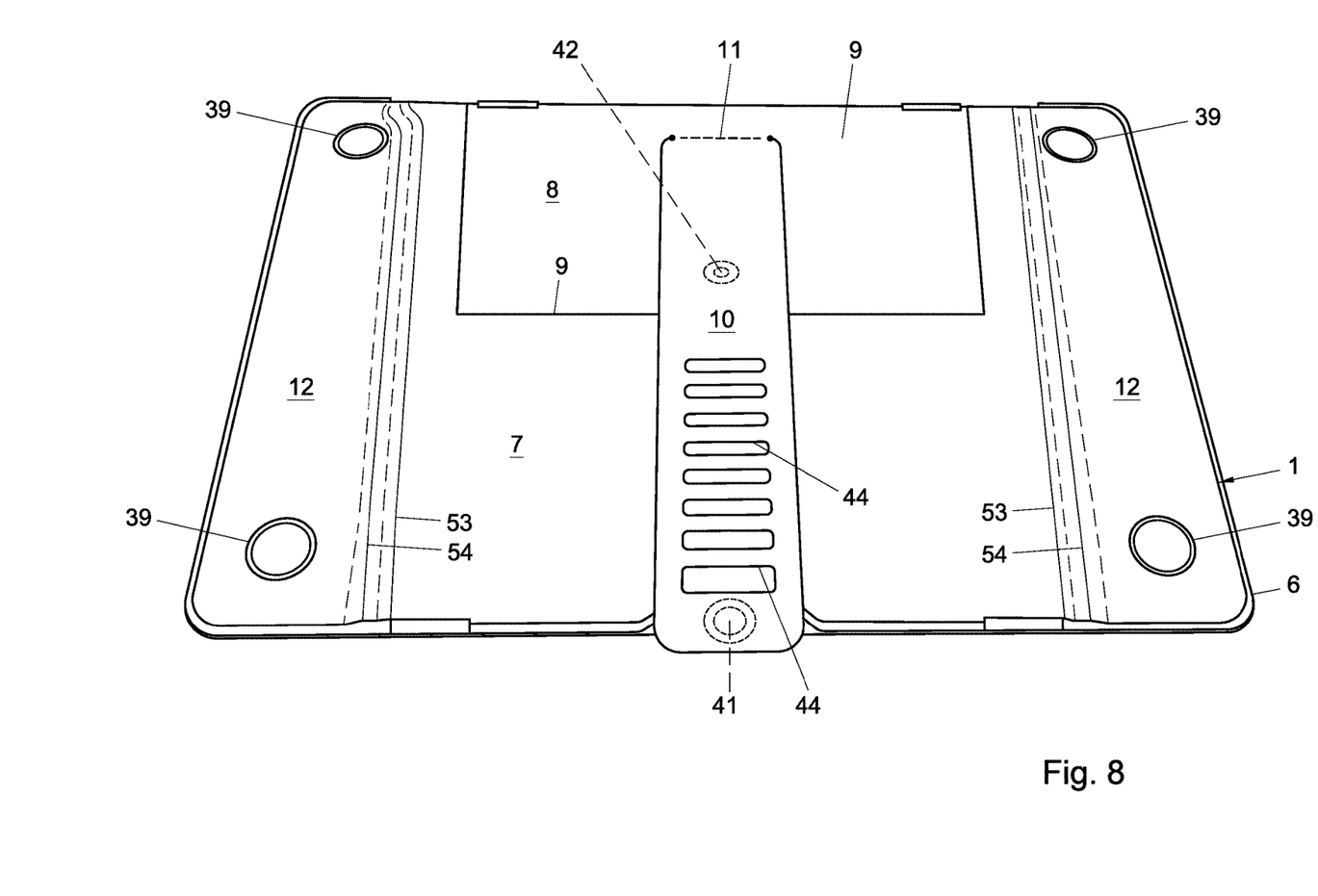
FIG. 8 is a perspective bottom view of the stand and computer as shown in FIG. 7 the stand being in flat-folded condition.

The panel members 7', 8', and accordingly the first panel and second panels 7, 8 may be of a non-flat shape and for instance have monoaxially and/or biaxially curved portions to closely follow the shape of the bottom of a computer model for which the stand 1 is dedicated when in mounted condition, as is illustrated by FIGS. 7 and 8. This allows increasing stiffness without adding to the thickness of the device-stand combination, reduces the extent to which edges of the stand project from the computer and causes the stand to be particularly unobtrusive visually.

The central layer 22 is laminated against the first outer layer 24, preferably by an adhesive. The central layer is preferably of a polymeric material, such as polyethylene or polypropylene that has a suitable stiffness for the angle setting tongue 10 to be operable easily and a good resistance against repeated bending. If more stiffness than provided by the central layer 22 only is desired, the angle setting tongue may be equipped with reinforcements, for instance in the form of portions of special reinforcements, for instance in the form of a thin layer of fiber reinforced material. The angle setting tongue may also be stiffened by portions of the first outer layer located so as to be opposite of areas of the first panel where the first outer layer is left out when the stand is in flat-folded condition. However, for flatness, simplicity of construction and ease of operation, it is preferred that the angle setting tongue is entirely free of material of the relatively stiff first outer layer.

A second outer layer 36 is laminated against central layer 22 and against outer portions of the first outer layer 24 that project beyond the central layer 22. The second outer layer 36 is of a thin film material and is more flexible and more easily deformable than the central layer 22. Flaps 12 of the very flexible second outer layer 36 project beyond edges of the central layer and beyond edges 14 of the first outer layer 24 which form contours of portions of the first outer layer 24 projecting from the central layer 36. The flaps 12 are provided with a layer of pressure sensitive self-adhesive material for attaching the stand 1 to the bottom 3 of a device 2 to be supported. Thus, the second outer layer 36 forms a cover that forms a smooth transition covering the edges of the central layer 22 and the first outer layer 24 when the stand 1 is attached to the device to be supported. Also, the flaps 12 smoothly accommodate to the shape of the bottom of the device and, due to their thickness smaller than the thickness of the other layers 22, 24, also the edges of the second outer layer 36 form a hardly noticeable step relative to the bottom of the device to be supported.

A portion of the flexible central layer 24 projecting away from the first or second panel member forms the angle setting tongue 10. Portions of the angle setting tongue 10 located opposite parts of the first layer 24 when the stand is in a flat folded transport position are free from material of the first layer. Thus, the angle setting tongue 10 adds very little or nothing to the overall thickness of the stand.

The first outer layer 24 is equipped with adhesive pads 38 for providing an additional connection of the first outer layer 24 to the bottom of the device to be supported. Due to flexibility of the portions of the stand projecting obliquely upwardly from the hinge 9 the weight of a display of a supported laptop computer may otherwise cause the computer to tilt backward about the upper end of the second panel 8. Such pads 38 may have a thickness of for instance 2-4 mm to act as spacers for providing a spacing between the stand 1 and a device to which the stand is attached for ventilation purposes.

In the second outer layer 36, openings 39 are provided for support feet of the computer to be supported.

The second outer layer 36 further forms a support for magnets 40, 41, 42 arranged in openings in the central layer 22. The magnets 40, 41, 42 are fixed to the self-adhesive face of the second outer layer 36 and serve for retaining the second panel 8 and, respectively, the angle setting tongue 10 against the first outer layer 24, i.e. in a flat configuration in-line with the first panel 7, when the stand 1 is in its flat transport configuration. The magnets 40 in openings in the second panel 8 are mounted to co-operate with opposite projections 43 of first outer layer of the first panel 7 into the first outer layer of the second panel 8. Embedded in openings in a layer of the stand, the magnets or other attachment members are efficiently incorporated in an unobtrusive manner and do not add to the thickness of the stand in folded condition. Instead of magnets, also other re-attachable fixations can be used such as a fixation with hook and loop tape.

Figure 1:
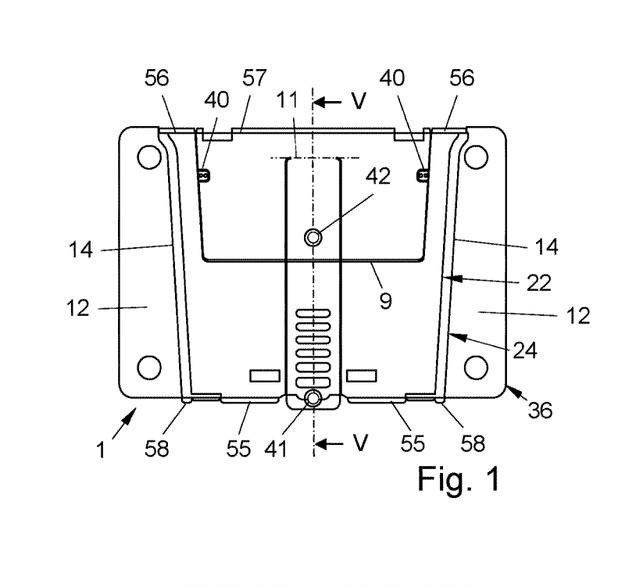
FIG. 1 is a top plan view of a first example of a stand according to the invention in which (also concealed) contours of three layers of the stand are superimposed.

In FIG. 1, flaps 55, 56, 57, 58 of the flexible second outer layer 36 are shown in extended orientations, but are to be folded around the edge portions of the first outer layer 22 and the central layer 24 along which these flaps extend. Thus, these edges are upholstered.

The angle setting tongue forming portion 10' of the central layer 22 and the angle setting tongue forming portion 10" of the second outer layer 36 are provided with mutually corresponding openings 44', 44" to be hooked to an attachment lip 45 of the first outer panel 24.

As is best seen in FIGS. 1 and 8, in the present example, the flexible central layer 22 is slightly less wide than the stiff outer layer 24, so that the all-over thickness of the stand decreases in two steps 53, 54, smoothed by the flexible outer layer 36, from a middle portion toward the flexible attachment flaps 12 (see FIGS. 7 and 8). It is however also possible to provide that the flexible central layer 22 is wider than the stiff outer layer 24, so that it covers outer side edges of the stiff outer layer 24. Thus, the steps 54 where the side edges of the stiff outer layer 24 are located would be even more smoothed out and accordingly less visible. The flexible central layer 22 may extend to the contour of the flexible outer layer 36 as is illustrated by alternative flexible central layer 22' contour represented by dash-and-dot lines in FIG. 4, or form the outer edges of the stand as a whole if it extends beyond the contour of the flexible outer layer 36 or if a flexible outer layer as the layer 36 is not provided at all so that the stand has only one single flexible layer in addition to the stiff layer. Then, only one thickness step, for instance as step 54, but more smoothed as explained above, would be obtained. In such embodiments, the flexible attachment flaps would also or completely be formed by the same flexible layer next to the stiff layer defining the panels, which flexible layer also forms the hinge between the first and second panels and the hinge of the angle setting leg. Accordingly, the attachment surface, for instance a layer of self adhesive material, would be formed on the face of the portions of that flexible layer that are part of the flexible attachment flaps.

If the flexible layer directly next to the stiff layer, which flexible layer also forms the hinge between the first and second panels and the hinge of the angle setting leg forms part of the flexible attachment flaps and covers the stiff layer on its side that is to be facing away from the device to be supported, a particularly strong connection between the stand and the device to be supported is achieved, since the flexible layer that also forms the hinges is, in view of that load bearing function, relatively strong, yet flexible enough to ensure full adhesive contact with the bottom of the device to be supported over a large surface area.

For accommodating to a non-flat shape of the bottom of the device to be supported, the flexible flaps may also be shaped accordingly and have monoaxially and/or biaxially curved portions, for instance to accommodate to a bottom portion of a computer as shown in FIGS. 7 and 8.

Figure 2:
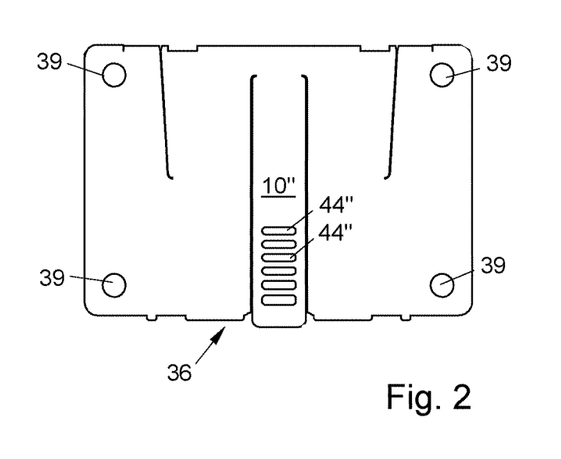
FIG. 2 is a plan view of an outer one of three layers of the stand shown in FIG. 1 at a side to be facing away from the supported device.
Figure 3:
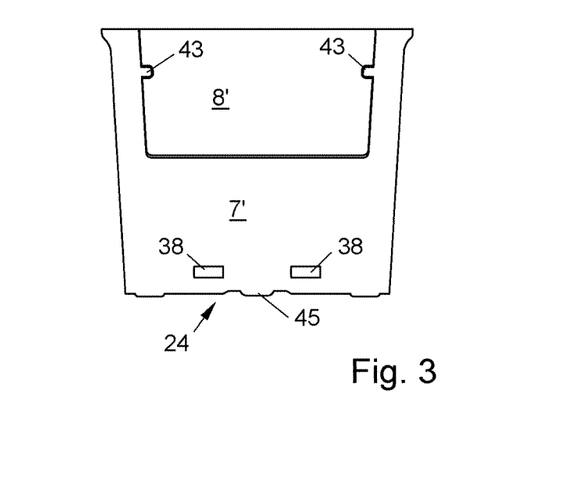
FIG. 3 is a plan view of a middle layer of the three layers of the stand shown in FIG. 1.
Figure 4:
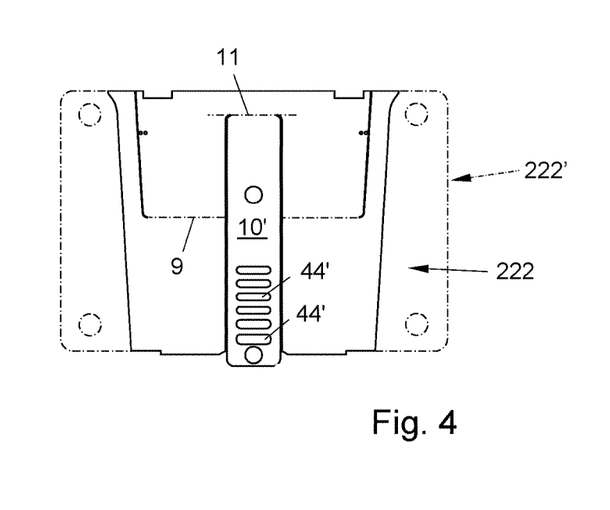
FIG. 4 is a plan view of an outer one of the three layers of the stand shown in FIG. 1 at a side to be facing towards the supported device.

For transporting and storing a stand according to the present invention, for instance in the course of distribution of manufactured stand or if a stand is temporarily detached from a device, it is advantageous if the flexible attachment flaps are protected against damage, for instance in the form of wrinkling and/or sticking of the attachment surface to surfaces from which it cannot be released (easily) without damage. To this end, the attachment surfaces of two or more flexible attachment flaps may be attached to a common backing substrate plate with a stiffness for retaining said flaps in orientations that are substantially parallel to each other. The backing substrate plate may for instance be of the same shape as the largest layer, in this example the second outer layer 36 as shown in FIG. 2 (which can accordingly be considered as a representation of such a substrate plate as well), so that it can be cut to shape together with the second outer layer, or be of a larger shape which provides enhanced protection and facilitates re-attaching a used stand to the substrate for temporary storage. The substrate plate may be further reinforced to also protect the stand as a whole from deformation during transport and storage.

In FIGS. 9-14 a second example of a stand 101 according to the invention is shown. Also this stand has three layers 122, 124, 136 that are laminated to each other. In this example, the layer having the highest flexural stiffness is the central layer 124. The first outer layer 122 at the side of the stand facing the device to be supported when in use is more flexible than the central layer 124 and preferably made of a polymer material such as polyethylene or polypropylene. When mounted to the bottom of a device to be supported, the first outer layer 122 and the central layer 124 are covered by a second outer layer 136 that is thinner and more flexible and more easily deformable than the first outer layer 122.

The first, stiff layer 124 is composed of mutually separate panel members 107', 108', which define the first panel and second panels 107, 108 of the stand 101. The panel members 107', 108' of the first outer layer 124 are preferably made of steel which allows to achieve a high stiffness at a small thickness and which is a magnetic material, so it can co-operate with magnets embedded in the central layer 122.

As in the first example, the second outer layer forms flaps 112 that project beyond outermost edges 114 of the covered layers 122 and are adhesively attached. The flaps securely attach the stand 101 to a bottom of the device to be supported and provide, so that a smooth transition with no substantial abrupt steps over these edges and to the bottom of the device is obtained and a smooth accommodation to the shape of the bottom of the device is achieved. The flaps 112 extend along the opposite side edges 114 of the first outer layer 122 and along portions of the first outer layer 122 and the central layer 124 to the side of a distal end of the second panel 108.

Figure 9:
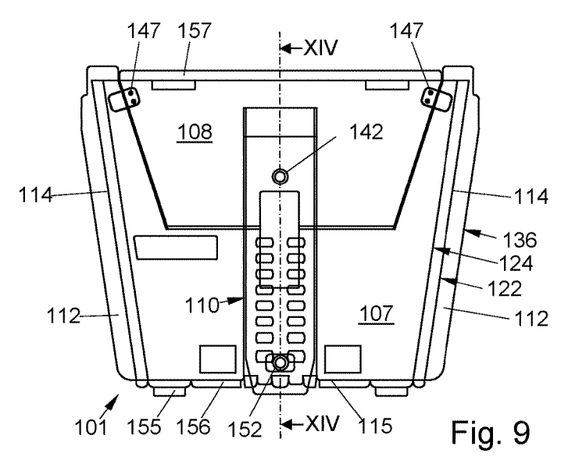
FIG. 9 is a top plan view of a second example of a stand according to the invention in which (also concealed) contours of three layers of the stand are superimposed.
Figure 10:
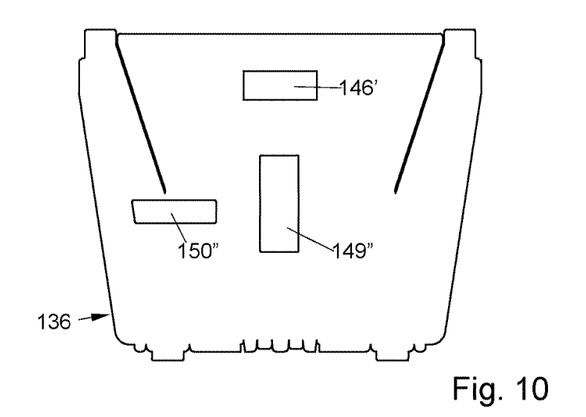
FIG. 10 is a plan view of an outer one of three layers of the stand shown in FIG. 9 at a side to be facing away from the supported device.
Figure 11:
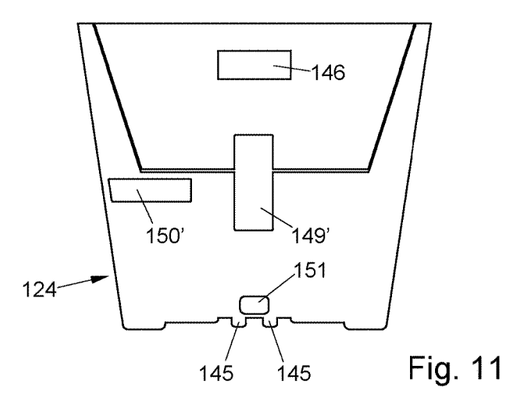
FIG. 11 is a plan view of a middle layer of three layers of the stand shown in FIG. 9.
Figure 12:
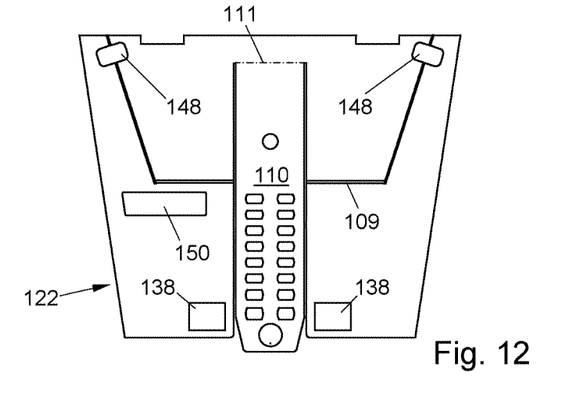
FIG. 12 is a plan view of an outer one of the three layers of the stand shown in FIG. 1 at a side to be facing towards the supported device.
Figure 13:
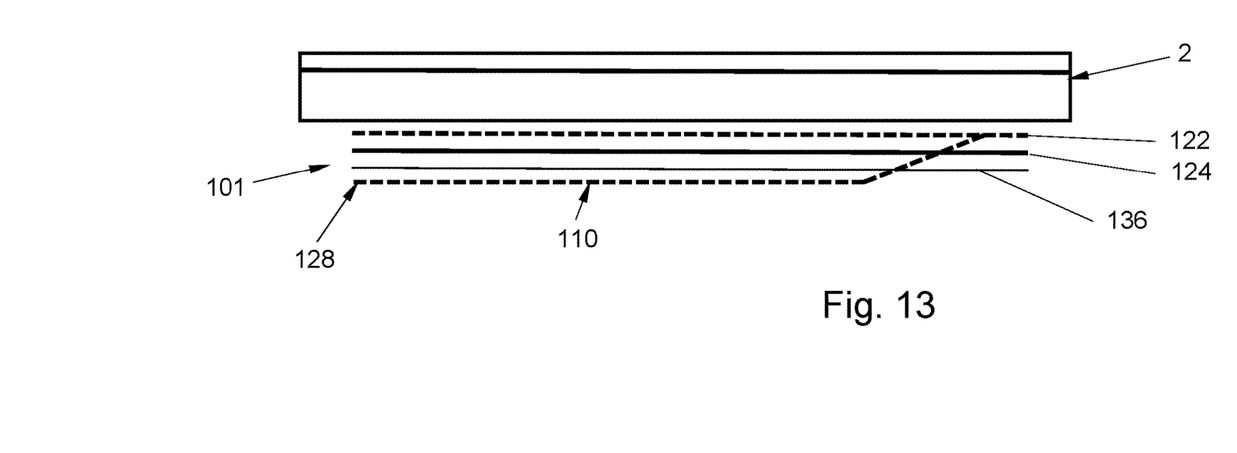
FIG. 13 is a schematic cross-sectional side view of a laptop and a stand in collapsed condition in side view along the line XIV-XIV in FIG. 9.
Figure 14:
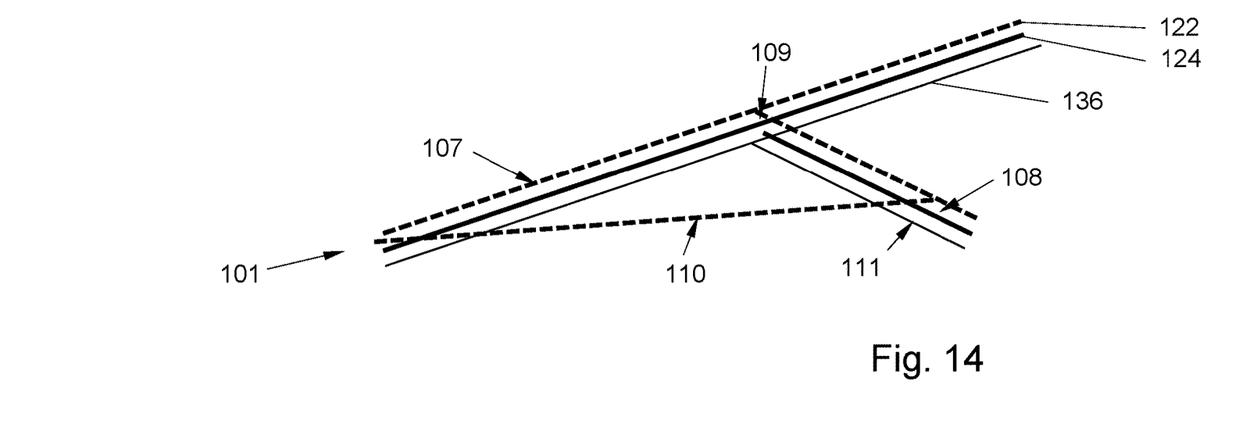
FIG. 14 is a schematic side view of the stand according to FIGS. 9 and 13 in a configuration for use supporting a laptop computer.

In FIG. 9, flaps 155, 156, 157 of the flexible second outer layer 136 are shown in extended orientations, but are to be folded around the edge portions of the first outer layer 122 and the central layer 124 along which these flaps extend. Thus, these edges are upholstered.

In the central layer 124 and the second outer layer 136, openings 146, 146' are formed at corresponding positions through which openings an angle setting tongue 110 extends from one side of the central and second outer layers 124, 136 to the opposite side of these layers 124, 136. Because the angle setting tongue 110 projects to an attachment 145 for maintaining a selected angle adjustment from a side of the stiff central layer 124 of the second panel 108 facing away from this attachment 145, tension force exerted via the angle setting tongue 110 pulls the first outer layer 122 against a panel 108' of the central layer defining the second panel 108. Thus, the first outer layer 122 of which the angle setting tongue forms a part is not pulled away from the central layer 124 when the stand 101 is loaded by a device 2 carried thereby.

In the first outer layer 122, adjacent a distal end of the second panel, areas 148 are left free for accommodating attachment members 147 for releasably holding the second panel 108 in a position generally co-planar with the first panel 107, so that the second panel 108 is held in-line with the first panel 107 when the stand 101 is in its flat transport position.

The central layer 124 is preferably made of steel, aluminium and/or composite materials, such as a resin/fiber composite. Magnets or magnetic elements 148 are embedded in the central layer 124 for co-operation with magnets or magnetic material of the attachment member 147 embedded in the first outer layer 122 if the central layer 324 of the second panel 308 is non-magnetic.

Corresponding openings 149', 149" and 150, 150', 150" in the central layer 124 and the first and second outer layers 122, 136 are provided for ventilation and/or for allowing access to contact sockets in the bottom of a supported device 2.

As in the first example, the first outer layer 122 is equipped with adhesive pads 138 for providing an additional connection of the first outer layer 122 to the bottom of the device 2 to be supported.

At the free end of the angle adjustment tongue 110 a magnet or magnetic element 152 is provided for co-operation with a magnet or magnetic element 151 embedded in the central layer 124 near the attachment hooks 145, so that the angle adjustment tongue 110 is held flat against the second outer layer 136 (covering the magnet 151) when the stand is in transport position. For the same purpose, another magnet 342 is arranged more proximally in the angle adjustment leg 310.

Within the framework of the present invention as set forth in the claims, many other embodiments are conceivable. For the stand may for instance form a part of the device to be supported. To that end, it is preferred that the first panel or the stiff layer thereof forms a part of or constitutes a bottom of a housing of the device to be supported. It is also possible to provide that the bottom part of the housing is provided with a recess for receiving the flexible layer or layers of the first panel, the entire first panel or the entire stand in flat-folded condition.

The invention claimed is:

1. A stand for a portable device with a graphic user interface display, such as a laptop computer or a tablet computer, the stand allowing the device to be supported with a bottom face at an oblique angle relative to a top surface carrying the stand, the stand comprising:
   a first panel;
   a second panel hinged so as to be pivotable relative to the first panel about a first hinge axis, so as to support the first panel at said oblique angle when in an unfolded operating position; and
   an angle setting tongue hinged so as to be pivotable relative to the first panel or the second panel about a second hinge axis spaced from the first hinge axis and having a free end releasably connectable to the other one of the first panel and the second panel at positions at a distance below the first hinge axis, when in the unfolded operating position, for setting an angle between the first panel and the second panel; wherein
   a first panel member of a first layer defines the first panel;
   a second panel member of the first layer defines the second panel;
   the first and the second panel members are attached to a second layer which is more flexible than the panel members of the first layer, a portion of the second layer between adjacent edges of said first and second panel members forming a hinge about which the second panel is pivotable relative to the first panel about the first hinge axis;
   the angle setting tongue comprises a portion of the second layer projecting away from the first or second panel member; and
   all portions of the angle setting tongue located opposite parts of the first layer when the stand is in a flat folded transport position, are free from material of the first layer.

2. The stand according to claim 1, wherein at least one attachment member is embedded in an opening in the first or second layer.

3. The stand according to claim 2, wherein the at least one attachment member includes a magnet or magnetically attractable element and arranged for co-operation with a magnet or magnetically attractable element that is part of or embedded in the second or, respectively, first layer for releasably holding at least one of the angle setting tongue and the second panel in a transport position parallel to the first panel.

4. The stand according to claim 2, wherein the at least one attachment member includes an elastically compressible pad.

5. The stand according to claim 1, further comprising a third layer more flexible and thinner than the first and second layers.

6. The stand according to claim 1, wherein the angle setting tongue projects from the second panel to an attachment member of the first panel, the second layer of the second panel being on a side of the first layer of the second panel facing away from the attachment member.

7. The stand according to claim 1, wherein portions of the first and the second panels are located opposite parts of the angle setting tongue when the stand is in a flat folded transport position, and wherein at least all of said portions of the first and the second panels are free from material of the second layer.

8. A method of manufacturing a stand for supporting a portable device with a graphic user interface display, such as a laptop computer or a tablet computer, with a bottom face at an oblique support angle relative to a top surface carrying the stand, the stand comprising:
 a first panel for supporting the device; and
 a second panel hinged so as to be pivotable relative to the first panel about a first hinge axis;
 an angle setting tongue hinged so as to be pivotable relative to the first panel or the second panel about a second hinge axis spaced from the first hinge axis and having a free end releasably connectable to the other one of the first panel and the second panel at positions at a distance below the first hinge axis for setting an angle between the first panel and the second panel; the method comprising:
 providing a first panel member of a first layer defining the first panel;
 providing a second panel member of the first layer defining the second panel;
 providing a blank forming a second layer which is more flexible than the panel members;
 attaching the first and the second panel members to the blank, such that a portion of the second layer between adjacent edges of said first and second panel members forms a hinge about which the second panel is pivotable relative to the first panel about the first hinge axis; and the angle setting tongue comprises a portion of the blank forming the second layer that projects away from the first or second panel member;
 wherein all portions of the angle setting tongue located opposite parts of the first layer when the stand is in a flat folded transport position, are free from material of the first layer.

9. The method according to claim 8, further comprising arranging at least one attachment member in an opening in at least one of the first and second layer.

10. The method according to claim 8, further comprising attaching a blank forming a third layer to at least one of the first and second layer, said third layer closing off at least one of said openings in the first and second layer.

* * * * *